US012586175B2

(12) United States Patent　　　　　(10) Patent No.:　US 12,586,175 B2
Chng et al.　　　　　　　　　　　　　(45) Date of Patent:　　Mar. 24, 2026

(54) APPARATUS, SYSTEM AND METHOD FOR DETERMINING A MATCH CONDITION FOR A PRINTED CIRCUIT BOARD TO A STENCIL

(71) Applicant: Inari Technology Sdn Bhd, Bayan Lepas (MY)

(72) Inventors: Chin Chooi Chng, Bayan Lepas (MY); Sabran Bin Samsuri, Bayan Lepas (MY); Sze Theng Chin, Kulim (MY)

(73) Assignee: Inari Technology Sdn Bhd, Bayan Lepas (MY)

( * ) Notice: Subject to any disclaimer, the term of this patent is extended or adjusted under 35 U.S.C. 154(b) by 708 days.

(21) Appl. No.: 17/747,232

(22) Filed: May 18, 2022

(65) Prior Publication Data

US 2022/0375053 A1　　Nov. 24, 2022

(30) Foreign Application Priority Data

May 18, 2021　(MY) ........................... PI2021002697

(51) Int. Cl.
G06T 7/00　　　　(2017.01)
H05K 3/12　　　　(2006.01)

(52) U.S. Cl.
CPC ........... G06T 7/001 (2013.01); H05K 3/1216 (2013.01); *G06T 2207/10116* (2013.01);
(Continued)

(58) Field of Classification Search
CPC ........... G06T 7/001; G06T 2207/30141; G06F 2115/12
See application file for complete search history.

(56) References Cited

U.S. PATENT DOCUMENTS 5,912,984 A * 6/1999 Michael .................. G06T 7/001
382/181
5,982,927 A * 11/1999 Koljonen .................. G06T 7/33
382/168
(Continued)

FOREIGN PATENT DOCUMENTS

CN　　110809375　　　2/2020
CN　　110809375 B * 1/2021　.............. H05K 3/341
(Continued)

OTHER PUBLICATIONS

English Abstract of CN 110809375.

*Primary Examiner* — Ted W Barnes
(74) *Attorney, Agent, or Firm* — Preston Smirman; SMIRMAN IP LAW, PLLC

(57)　　　　　　ABSTRACT

An apparatus for determining the condition of a printed circuit board, including a stencil database for storing a plurality of stencil data files corresponding to stencils of different dimensions, an image capturing device having an area where the printed circuit board is laid thereon for a surface profile of the printed circuit board to be captured for generating a surface data file of the printed circuit board, and a condition determination module that compares data from the surface data file with data from one or more stencil data file as a nominal reference via a matching process to determine the condition of the printed circuit board based on a set of categories. The printed circuit board is sent for further processing (i.e., stencil printing) after being determined to be in a match-successful condition where data from the surface data file falls within a tolerance of the nominal reference.

21 Claims, 6 Drawing Sheets

(52) U.S. Cl.
CPC ............... *G06T 2207/20081* (2013.01); *G06T 2207/30141* (2013.01); *H05K 2203/163* (2013.01)

(56) References Cited

U.S. PATENT DOCUMENTS

| | | | | |
|---|---|---|---|---|
| 6,317,513 B2 * | 11/2001 | Michael | ............... | H05K 3/3485 |
| | | | | 382/145 |
| 6,567,542 B1 * | 5/2003 | Koljonen | ............. | G06T 7/0006 |
| | | | | 382/147 |
| 6,938,227 B2 * | 8/2005 | Murphy | ............... | H05K 3/1225 |
| | | | | 716/139 |
| 10,481,199 B2 * | 11/2019 | Nurani | ........... | G01R 31/318516 |
| 11,775,731 B2 * | 10/2023 | Su | ........................ | G06F 30/398 |
| | | | | 716/137 |
| 2003/0021886 A1 * | 1/2003 | Baele | .................. | B41F 15/0818 |
| | | | | 427/98.5 |
| 2004/0089413 A1 * | 5/2004 | Murphy | ............... | H05K 3/1225 |
| | | | | 156/252 |
| 2005/0071996 A1 * | 4/2005 | Ray | ...................... | H05K 3/1225 |
| | | | | 29/829 |
| 2014/0210993 A1 * | 7/2014 | Butler | .................. | G06V 10/772 |
| | | | | 348/87 |
| 2019/0012421 A1 * | 1/2019 | Qian | ................... | H05K 3/1225 |
| 2019/0043745 A1 * | 2/2019 | Zhang | ............... | H01L 21/67259 |

FOREIGN PATENT DOCUMENTS

| | | | | | |
|---|---|---|---|---|---|
| JP | 2004013095 A | * | 1/2004 | ............. | G06T 7/001 |
| WO | WO-2012053181 A1 | * | 4/2012 | ............. | B41F 15/26 |

* cited by examiner

Bare PCB 10

801 — Loading Machine

100 — Apparatus

802 — Solder Printing Machine

803 — Solder Paste Inspection Machine

804 — Pick and Place Machine

805 — Solder Reflow Machine

806 — Optical Inspection Machine

807 — X-Ray Inspection Machine

808 — Unloader Machine

Assembled PCB 30

APPARATUS, SYSTEM AND METHOD FOR DETERMINING A MATCH CONDITION FOR A PRINTED CIRCUIT BOARD TO A STENCIL

CROSS-REFERENCE TO RELATED APPLICATION

The instant application claims priority to Malaysia Patent Application Serial No. PI2021002697 filed May 18, 2021, the entire specification of which is expressly incorporated herein by reference.

FIELD OF THE INVENTION

The invention relates to the art of stencil printing for depositing solder paste on printed circuit boards (PCB). More particularly, the invention relates to an apparatus, system, and method for determining a match condition for a PCB to a stencil.

BACKGROUND OF THE INVENTION

Stencil printing in the semiconductor industry refers to the deposition of solder paste on a bare printed circuit board (PCB). This is usually performed prior to the mounting of electronic components on the bare PCB and the solder reflow process. First, the bare PCB is laid flat, for a designated stencil to be placed over it. The designated stencil is designed to contain apertures corresponding to the size and location of the pads on the bare PCB. Then, the apertures of the designated stencil are aligned to the pads of the bare PCB. Afterwards, using a squeegee, solder paste is applied throughout the stencil for the paste to be deposited within spaces defined by the edges of the apertures and pads. After the stencil is separated, the pads of the bare PCB would contain the deposited solder paste. With this, stencil printing is completed.

Conventionally, the designated stencil is made with the assumption that their apertures would be able to align to the pads of all bare PCB with a similar layout. However, as the form factors of a printed circuit board decrease, it becomes more susceptible to environmental factors that can alter its physical dimensions. In particular, this leads to the elongation or shrinkage of the bare PCB, hence shifting the pad locations on the bare PCB from their original position. Hence, the pads of this bare PCB may not align to the apertures of the designated stencil.

Because of this, this bare PCB may be considered defective, as the designated stencil cannot be used for performing stencil printing on the bare PCB. As such, the bare PCB may become part of sunk cost in the PCB manufacturing process. Therefore, it is preferable that there is an apparatus and system that can evaluate the changes in physical dimensions of the bare PCB, and can automatically determine a designated stencil that can match to the bare PCB, in terms of aligning the apertures of the stencil to the pads of the bare PCB within a pre-determined tolerance level.

There are a few patented technologies over the prior art that are related to, or similar to, matching a stencil to a printed circuit board that may address the aforementioned problem. Among them is CN110809375 (A), which discloses a system and method that attempts to overcome the alignment mismatch between a PCB and a stencil caused by the thermal expansion or contraction of the PCB. It breaks the designated stencil into two separate pieces, with one piece aligning to the pads on the left side of the bare PCB, while the other piece aligned to the pads on the right side of the bare PCB. Here, stencil printing is performed twice for the solder paste to be on the pads of the bare PCB.

Another patented technology is U.S. Pat. No. 6,938,227B2, which discloses a system and method for modifying apertures of a stencil based on minor design changes in a bare PCB. This is so that the PCB stencil can be matched to the new bare PCB. In particular, this system and method require Gerber data of the PCB to be provided so that the stencil can be modified.

However, both the aforementioned patented technologies fail to fully solve the aforementioned problem. For CN110809375 (A), it is not guaranteed that separating the stencil into two ensures that all the pads of the bare PCB can align to the stencil. It also requires stencil printing to be done twice. As for U.S. Pat. No. 6,938,227B2, it particularly relates to changing designs of the stencil based on a client's requirement instead of environmental factors, as such may be unable to address the aforementioned problem.

Accordingly, it would be desirable to have an apparatus and system that can evaluate the changes in physical dimensions of the bare PCB, and can automatically determine a match condition when trying to match the bare PCB to a designated stencil. Preferably, in a match-successful condition, the apertures of the stencil would be aligned to the pads of the bare PCB when stencil printing is carried out.

SUMMARY OF THE INVENTION

The main objective of the invention is to provide an apparatus, system, and method for determining a match condition for a PCB to a stencil. To achieve this objective, the apparatus is capable of obtaining the surface profile of a bare PCB and convert it into a PCB surface data file. The data from the PCB surface data file is compared with data from one or more stencil data file as a nominal reference. A match-successful condition is determined when data from the surface data file falls within a tolerance of the nominal reference of the data from a stencil data file. The stencil data file corresponds to the stencil that shall be used with the PCB during the stencil printing process.

Advantageously, the proposed invention can overcome alignment mismatch between the pads on a PCB panel and the apertures on a PCB stencil that occurs due to the elongation or shrinkage of the PCB panel. This is caused by the thermal expansion and contraction of the PCB substrate as an effect of the external environment. Overcoming alignment mismatch is especially crucial for PCBs having pads of small sizes (<200 $\mu$m) that easily deviate from their original positions. The proposed invention, which includes an apparatus, system and method, overcomes this problem and therefore solder will not spill outside the pads during the stencil printing.

The present invention intends to provide an apparatus for determining condition of a printed circuit board, comprising a stencil database for storing a plurality of stencil data files corresponding to stencils of different dimensions, an image capturing device having an area where the printed circuit board is laid thereon for a surface profile of the printed circuit board to be captured for generating a surface data file of the printed circuit board, and a condition determination module that compares data from the surface data file with data from one or more stencil data files as a nominal reference via a matching process to determine the condition of the printed circuit board based on a set of categories. The printed circuit board is sent for further processing upon being determined to be in a match-successful condition where data from the surface data file falls within a tolerance of the nominal reference.

Preferably, regarding the apparatus, the stencil data file comprises diagonal length dimension data, aperture coordinate data, or both, based on a stencil specification image having an aperture layout of the stencil.

Preferably, regarding the apparatus, the surface data file comprises diagonal length dimension data, pad coordinate data, or both, based on a surface profile image having a pad layout of the printed circuit board.

Preferably, regarding the apparatus, the apparatus further comprises a knowledge database for storing the surface data file of the printed circuit board with a match-failure condition when the data from the surface data file falls out of the tolerance of the nominal reference for all stencil data files.

Preferably, regarding the apparatus, the apparatus further comprises a knowledge module that is interfaced with the knowledge database for generating a new stencil data file based on the surface data file of the printed circuit board with the match-failure condition, wherein the new stencil data file is stored as one of the stencil data files for future matching processes.

Preferably, regarding the apparatus, the categories for the match-successful condition include any one or a combination of normal, elongated or shrunk.

Preferably, regarding the apparatus, the stencil specification images of the stencil data files include any one or a combination of a normal diagonal length stencil specification image, an enlarged diagonal length stencil specification image, and a reduced diagonal length stencil specification image.

Preferably, regarding the apparatus, the apparatus further comprises a loading bay where the printed circuit board is placed thereon, at least one unloading bay for unloading the bare printed circuit from the apparatus, and a conveyor mechanism connecting the loading bay, the image capturing area and the unloading bays.

Additionally, the present invention intends to provide a system for conducting solder printing on a printed circuit board, comprising an apparatus for determining the condition of a printed circuit board, including a stencil database for storing a plurality of stencil data files corresponding to stencils of different dimensions, an image capturing device having an area where the printed circuit board is laid thereon for a surface profile of the printed circuit board to be captured for generating a surface data file of the printed circuit board, a condition determination module that compares data from the surface data file with data from one or more stencil data file as a nominal reference via a matching process to determine the condition of the printed circuit board based on a set of categories. The system further comprises a solder printing machine for applying solder paste over one or more pads of the printed circuit board that is determined to be in a match-successful condition using a stencil, the match successful condition being where data from the surface data file falls within a tolerance of the nominal reference of the data from the stencil data file that corresponds to the stencil.

Preferably, regarding the system, the system further comprises a solder paste inspection machine for inspecting the solder paste applied on the printed circuit board.

Preferably, regarding the system, the system further comprises a solder reflow machine for reflowing the solder paste for a solder joint to be formed between the pads of the printed circuit board and electronic components on the printed circuit board.

Preferably, regarding the system, the system further comprises either or both an automatic optical inspection machine and an automatic X-ray inspection machine for inspecting the solder joint formed between the pads of the bare printed circuit board and the electronic components.

Preferably, regarding the system, the system further comprises either or both a loading machine for loading the printed circuit board to the system, and an unloading machine for unloading the printed circuit board from the system.

Preferably, regarding the apparatus within the system, the stencil data file of the apparatus comprises diagonal length dimension data, aperture coordinate data, or both, based on a stencil specification image having an aperture layout of the stencil.

Preferably, regarding the apparatus within the system, the surface data file comprises diagonal length dimension data, pad coordinate data, or both, based on a surface profile image having a pad layout of the printed circuit board.

Preferably, regarding the apparatus within the system, the apparatus further comprises a knowledge database for storing the surface data file of the printed circuit board with a match-failure condition when the data from the surface data file falls out of the tolerance of the nominal reference for all stencil data files.

Preferably, regarding the apparatus within the system, the apparatus further comprises a knowledge module that is interfaced with the knowledge database for generating a new stencil data file based on the surface data file of the printed circuit board with the match-failure condition, the new stencil data file is stored as one of the stencil data files for future matching processes.

Preferably, regarding the apparatus within the system, the categories for the match-successful condition includes any one or a combination of normal, elongated or shrunk.

Preferably, regarding the apparatus within the system, the stencil specification images of the stencil data files include any one or a combination of a normal diagonal length stencil specification image, an enlarged diagonal length stencil specification image, and a reduced diagonal length stencil specification image.

Preferably, regarding the apparatus within the system, the apparatus further comprises a conveyor mechanism that directs the printed circuit board to be moved throughout the system.

Moreover, the present invention intends to provide a method for determining condition of a printed circuit board, comprising the steps of capturing a surface profile of the printed circuit board by an image capturing device for generating a surface data file of it, comparing data from the surface data file with data from one or more stencil data files stored in a stencil database as a nominal reference via a matching process executed by a condition determination module, each stencil data file corresponding to stencils of different dimensions, and determining the condition of the printed circuit board based on a set of categories by the condition determination module. The printed circuit board is sent for further processing upon being determined to be in a match-successful condition where data from the surface data file falls within a tolerance of the nominal reference.

Preferably, regarding the method, the stencil data file of the apparatus comprises diagonal length dimension data, aperture coordinate data, or both, based on a stencil specification image having an aperture layout of the stencil.

Preferably, regarding the method, the surface data file comprises diagonal length dimension data, pad coordinate data, or both, based on a surface profile image having a pad layout of the printed circuit board.

Preferably, regarding the method, wherein the step of comparing data from the surface data file with data from one or more stencil data files further comprises the steps of comparing the diagonal length data of the surface data file with the diagonal length data of the stencil data file as the nominal reference, and comparing the pad coordinate data of the surface data file with the aperture coordinate data of the stencil data file as the nominal reference.

Preferably, regarding the method, the method further comprises the step of storing, in a knowledge database, the surface data file of the printed circuit board with a match-failure condition when the data from the surface data file falls out of the tolerance of the nominal reference for all stencil data files.

Preferably, regarding the method, the method further comprises the step of generating, by a knowledge module interfaced with the knowledge database, a new stencil data file based on the surface data file of the printed circuit board with the match-failure condition, wherein the new stencil data is stored as one of the stencil data files for future matching processes.

Preferably, regarding the method, the categories for the match-successful condition includes any one or a combination of normal, elongated or shrunk.

Preferably, regarding the method, the stencil specification images include any one or a combination of a normal diagonal length stencil specification image, an enlarged diagonal length stencil specification image, and a reduced diagonal length stencil specification image.

One skilled in the art will readily appreciate that the invention is well adapted to carry out the objects and obtain the ends and advantages mentioned, as well as those inherent therein. The embodiments described herein are not intended as limitations on the scope of the invention.

BRIEF DESCRIPTION OF THE DRAWINGS

To facilitate an understanding of the invention, there is illustrated in the accompanying drawing the preferred embodiments from an inspection of which when considered in connection with the following description, the invention, its construction and operation and many of its advantages would be readily understood and appreciated.

DETAILED DESCRIPTION OF THE INVENTION

The present invention relates to an apparatus 100 that can determine the match condition for a bare printed circuit board (PCB) 10 so that it can be sorted and matched to a suitable stencil for stencil printing. The invention may also be presented in a number of different embodiments with common elements. According to the concept of the invention, the apparatus 100 comprises an image capturing device 110, a conditioning determination module 121, and a stencil database 130. Additionally, the apparatus 100 may also be a member within a system for conducting stencil printing on a bare PCB 10 and forming an assembled PCB 30.

It should be noted that while the present invention is focused on determining the condition of a bare PCB 10 for matching it to a suitable stencil, its usage is not meant to be limited to printed circuit boards only, and may include other types of electronic circuitry such as lead frame, hybrid circuits, partially assembled PCB or the likes.

Preferably, the type of bare PCB 10 that is used with the apparatus is a PCB panel, which is a large board comprised of more than one PCB segments. However, it should be noted that this use case is non-limiting, and PCB of other shapes and sizes can also be used with the apparatus 100.

From here on, it will be understood that, although the terms first, second, etc. may be used herein to describe various elements, components, regions, layers or sections, these elements, components, regions, layers or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present invention.

The invention will now be described in greater detail, by way of example, with reference to the drawings.

Figure 1:
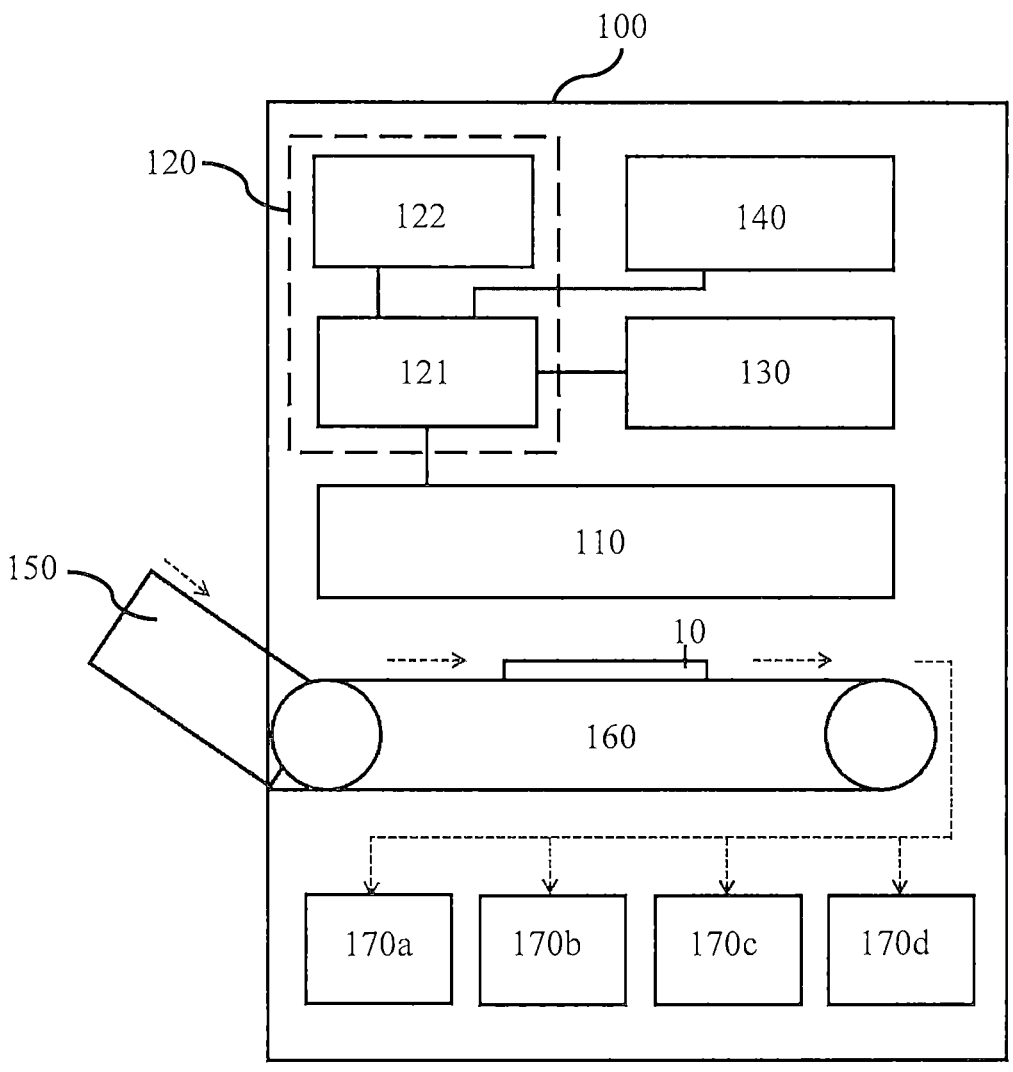
FIG. 1 is a diagram illustrating a simplified depiction of the apparatus of the present invention.

FIG. 1 illustrates a simplified depiction of the apparatus 100 of the present invention, which comprises hardware components, software modules and mechanical parts. In particular, it at least has an image capturing device 110, a processor 120 running software modules such as a condition determination module 121 and user interface module 122, a stencil database 130, a knowledge database 140, a loading bay 150, a conveyor mechanism 160, and four unloading bays 170a, 170b, 170c, 170d. FIG. 1 also shows the bare PCB 10 laid on the conveyor belt of the conveyor mechanism 160, with the dotted arrows indicating the movement of the bare PCB 10 throughout the apparatus 100 from the loading bay 150 to one of the four unloading bays 170a, 170b, 170c, 170d.

As the bare PCB 10 is conveyed from the loading bay 150 to reach underneath the image capturing device 110, the conveyor belt pauses for the image capturing device 110 to perform non-contact surface profilometry for the surface profile of the bare PCB 10 to be captured. The techniques of non-contact surface profilometry are well-known in the art, and may be conducted using optics, ultrasound, or both.

Figures 2, 3:
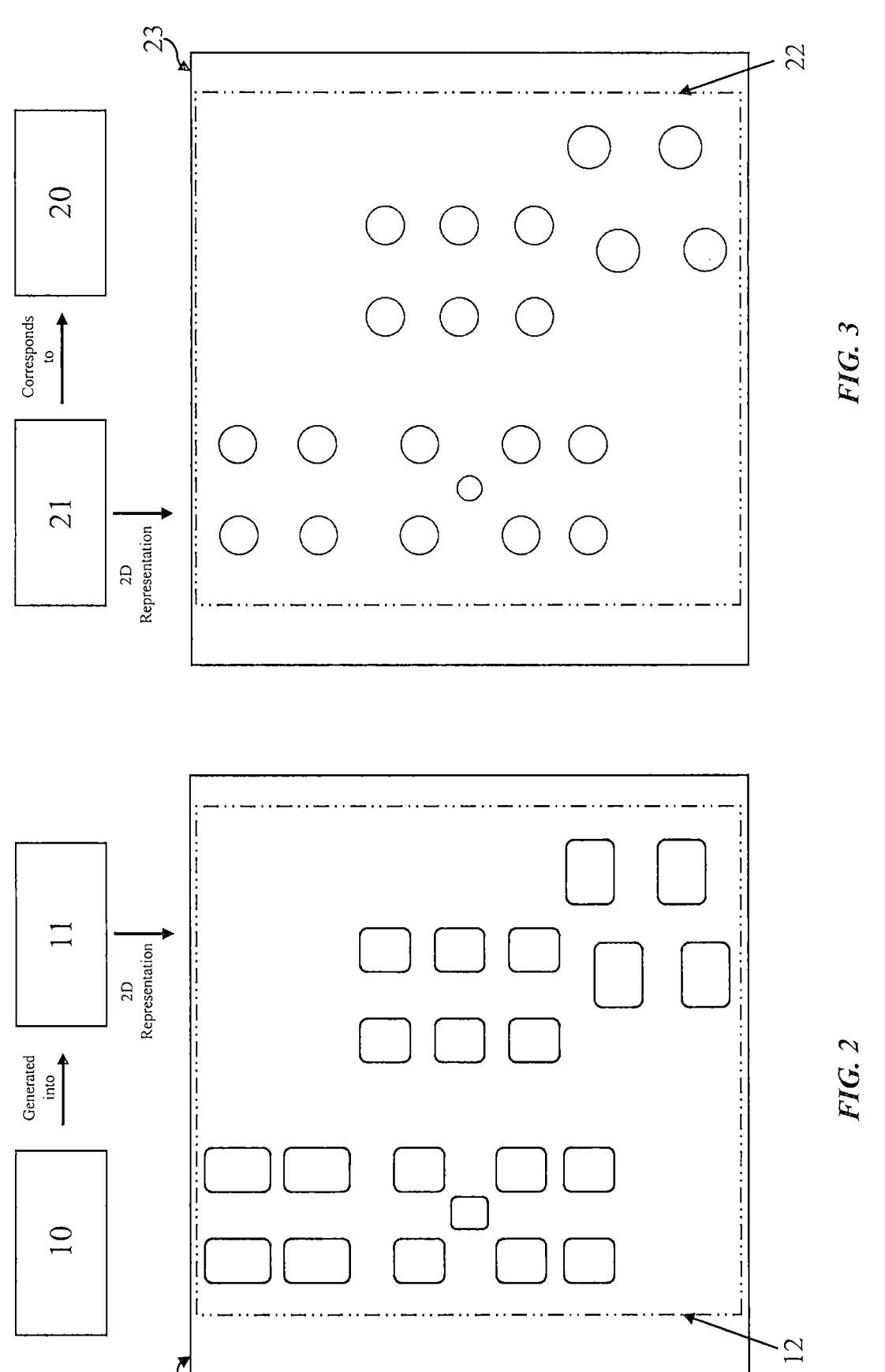
FIG. 2 is an example embodiment of a constructed surface profile image of a bare PCB from the PCB surface data file, constructed by the software modules of the apparatus, with the data file generated by the image capturing device of the apparatus.
FIG. 3 is an example embodiment of a constructed stencil specification image representing a physical stencil from the stencil data file the software modules of the apparatus, with the data file stored within the stencil database of the apparatus.

Upon completion of surface profilometry, the image capturing device 110 converts the captured surface profile of the bare PCB 10 into a PCB surface data file 11, which may be used by the software modules of the apparatus 100 to construct a two-dimensional (2D) image representation referred to as a surface profile image 12 that includes the pad layout 13 of the bare PCB 10. This is depicted in FIG. 2. Preferably, the PCB surface data file 11 is in the format of a Gerber file extension (.gbr). This PCB surface data file 11 may further include datasets related to the bare PCB 10, which may be dimension data and pad coordinate data. The dimension data may comprise the diagonal length corresponding to the bare PCB 10, whereas the pad coordinate data may comprise x-y coordinate data of the pad layout 13, which corresponds to the x-y coordinates of each pad on the bare PCB 10.

The PCB surface data file 11 is then sent to the condition determination module 121, which may be running on a processor 120. This processor may be, but will not be limited to, a microprocessor, an application-specific integrated circuit (ASIC) or the likes. After receiving the PCB surface data file 11, the condition determination module 121 interfaces with the stencil database 130 to request a stencil data file 21. Preferably, this database stencil 130 may be a form of a data storage device such as a hard disk drive (HDD) or a solid-state drive (SSD). Alternatively, the stencil database 130 may be in the form of volatile memory which may be, but not limited to, dynamic random access memory (DRAM), static dynamic random access memory (SRAM), and their synchronous variants.

The stencil data file 21 retrieved from the stencil database 130 may be used by the software modules of the apparatus 100 to construct a 2D image representation referred to as a stencil specification image 22 that includes the aperture layout 23, corresponding to a physical stencil 20. This is shown in FIG. 3. Preferably, the stencil data file 21 is also the format of a Gerber file extension (.gbr). This stencil data file 21 may further include datasets related to the physical stencil 20, which may be dimension data and aperture coordinate data. The dimension data may comprise the diagonal length corresponding to the physical stencil 20, whereas the aperture coordinate data may comprise x-y coordinate data of the aperture layout 23, which corresponds to the x-y coordinates of each aperture on the physical stencil 20.

Having both the PCB surface data file 11 and the stencil data file 21, the condition determination module 121 shall conduct a matching process by comparing the datasets available in both data files (i.e. the dimension data and coordinate data) to determine if the aperture layout 23 can align to the pad layout 13. This may be interpreted visually as superimposing the stencil specification image 22 is over the surface profile image 12, or vice versa. The condition determination module 121 is configured to allow for upper and lower limits of tolerance during the comparison between the datasets to account for the thermal expansion of the FR-4 substrate of the bare PCB 10. Upon conducting the matching process, the condition determination module 121 can produce one of the two types of match conditions, namely a match-successful condition or a match-failure condition.

Figure 4:
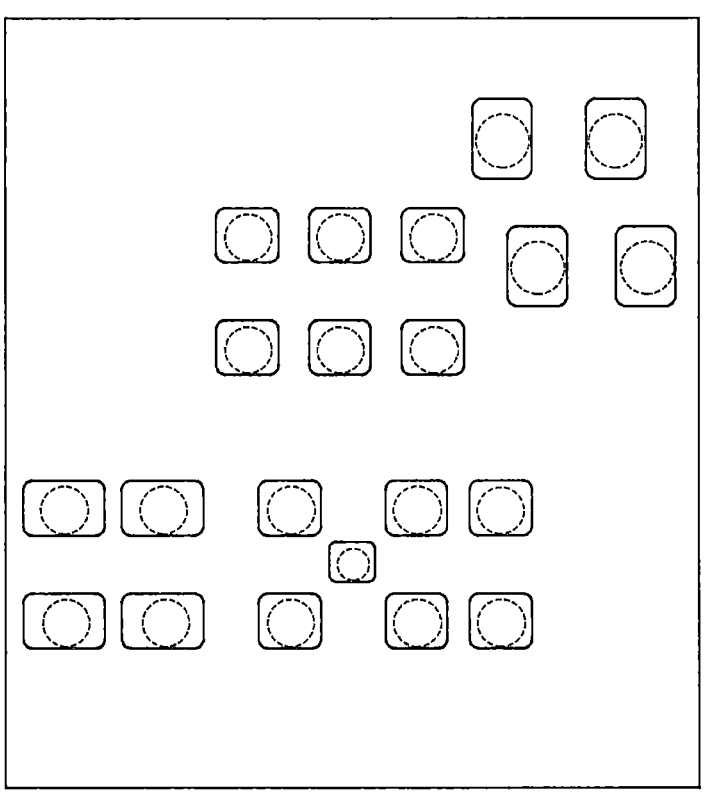
FIG. 4 is a diagram illustrating a match-successful condition, which is represented as when the pad layout of the surface profile image is aligned to the aperture layout of the stencil specification image.

A match-successful condition occurs when all sets of data available in both data files, after comparison, fall within the configured limits of tolerance. This will indicate that the aperture layout 23 of the stencil specification image 22 is fairly aligned to the pad layout 13 of the surface profile image 12. Such a condition is illustrated in FIG. 4. The match-successful condition further indicates that the physical stencil 20, which is represented by the stencil specification image 22, is suitable to be used with the bare PCB 10 for the stencil printing process, as no solder paste would spill over to the solder mask of the bare PCB 10 during the process.

Figure 5:
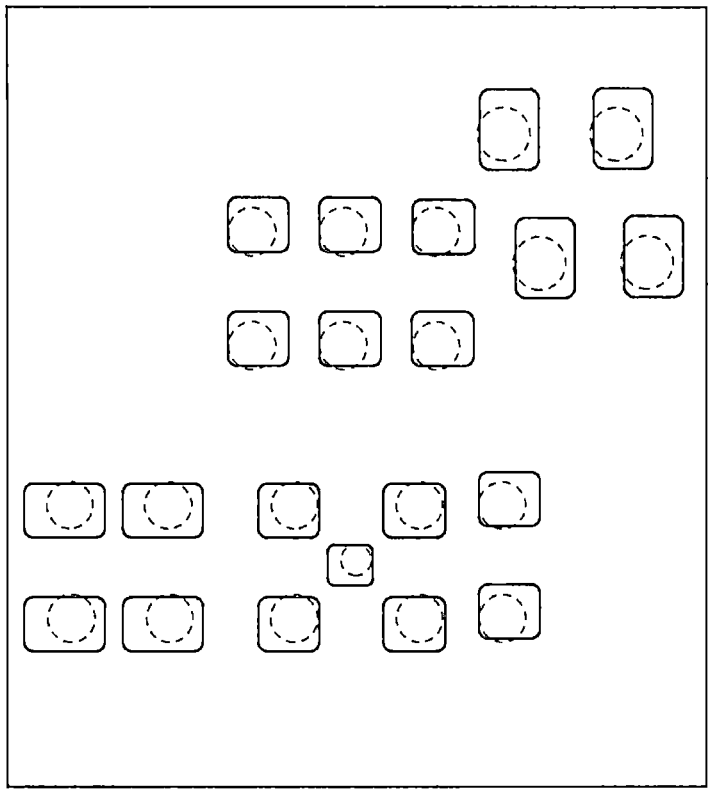
FIG. 5 is a diagram illustrating a match-failure condition, which is represented as when the pad layout of the surface profile image is not aligned to the aperture layout of the stencil specification image.

A match-failure condition occurs when either one or all the sets of data available in both data files, after comparison, fail to fall within the configured limits of tolerance. This will indicate that the aperture layout 23 of the stencil specification image 22 is not aligned to the pad layout 13 of the surface profile image 12. Such a condition is illustrated in FIG. 5. The match-failure condition further indicates that the physical stencil 20, which is represented by the stencil specification image 22, is not suitable to be used with the bare PCB 10 for the stencil printing process, as solder paste would spill over to the solder mask of the bare PCB 10 during the process.

Should a match-failure condition occur as determined by the condition determination module 121, the condition determination module 121 will request for an alternative stencil data file from the stencil database 130 to attempt to conduct the matching operation. This is because the stencil database 130 is configured to store more than one stencil data files, which are also in the Gerber file format (.gbr). This alternative stencil data file may be used by the software modules of the apparatus 100 to construct an alternative stencil specification image representation of an alternative physical stencil. Similar to as before, this stencil data file may further include datasets related to the alternative physical stencil, which may be dimension data and aperture coordinate data. The dimension data may comprise the diagonal length corresponding to the alternative physical stencil, whereas the aperture coordinate data may comprise x-y coordinate data of the apertures layout, which corresponds to the x-y coordinates of each aperture on the alternative physical stencil. Then, the datasets available in this alternative stencil data file is compared with the datasets available in the PCB surface data file 11 to determine if a match-successful condition occurs. Should the match-successful condition occurs, the alternative physical stencil which is represented by the alternative stencil specification image is suitable to be used with the bare PCB 10 for the stencil printing process. Should the match-failure condition occurs, the condition determination module 121 will once again request yet another stencil data file from the stencil database 130 to attempt to conduct the matching operation.

If however, even after requesting all the stencil data files stored in the stencil database 130 to conduct the matching operation, and a match-failure condition still occurs for the bare PCB 10, the bare PCB 10 will be regarded as "abnormal". Its PCB surface data file 11 is sent to be stored in knowledge database 140 to build up a database relating to failure information. The knowledge database 140 may be a hardware component within apparatus 100 having the form of a data storage device such as a hard disk drive (HDD) or a solid-state drive (SSD), or a remote cloud infrastructure. The knowledge database 140 may further interface with a knowledge module (not shown) that is preferably a remote cloud processing infrastructure. This knowledge module may attempt to overcome the match-failure condition. It may do so through trained artificial neural networks or convolutional neural networks, so that a new stencil data file suitable for the bare PCB 10 with the match-failure condition is generated. Alternatively, this knowledge module may allow for a user to directly create and design a new stencil data file to overcome the match-failure condition. The new stencil data file may then be stored in the stencil database 130 to be used in the future matching process.

A user interface module 122 would allow the user to interface with the apparatus 100 through a user interface (not shown). The user interface module 122 may be linked to the condition determination module 121 and act as an intermediary to construct and display the stencil specification image 22 and the surface profile image 12 on the user interface in a superimposed manner for the user to visually understand the results of the condition determination module 121. Furthermore, the tolerance from the comparison between datasets obtained from the PCB surface data file 11 and stencil data file 21, would also be displayed on the user interface through the user interface module 122.

As mentioned before, the condition determination module 121 conducts a comparison between the sets of data available in both the PCB surface data file 11 and the stencil data file 21 in the matching process. In the present embodiment of the invention, the dimension data and coordinate data from both files are compared to determine whether or not they fall within the upper and lower limits of the configured tolerance. Preferably, the dimension data from both files are compared first, and only after that, the coordinate data from both files are compared.

In regards to the dimension data, the PCB surface data file 11 preferably contains the diagonal length of the bare PCB 10, whereas the stencil data file 21 preferably contains the diagonal length of the physical stencil 20. With the diagonal length of the physical stencil 20 used as a nominal reference, the diagonal length of the bare PCB 10 is compared with this nominal reference to determine if the diagonal length of the bare PCB 10 falls within the limits of a configured diagonal length tolerance. Preferably, the configured diagonal length tolerance is ±30 μm.

In regards to the coordinate data, the PCB surface data file 11 preferably contains the pad coordinate data, while the stencil data file 21 preferably contains the aperture coordinate data. With the aperture coordinate data used as a nominal reference, the pad coordinate data is compared with this nominal reference to determine if the x-y coordinates of the pads 11 on the bare PCB 10 fall within the limits of a configured position offset tolerance. Preferably, the configured position offset tolerance is ±50 μm.

In the present embodiment of the apparatus 100, there are preferably three stencil data files 21a, 21b and 21c, each may be used by the software modules of the apparatus 100 construct three distinct stencil specification images 22a, 22b and 22c that represents three distinct physical stencils 20a, 20b and 20c. Preferably as well, these stencil data files include dimension data and aperture coordinate data. These three stencil data files and their constituents represent the categories for the match-successful condition.

Figure 6:
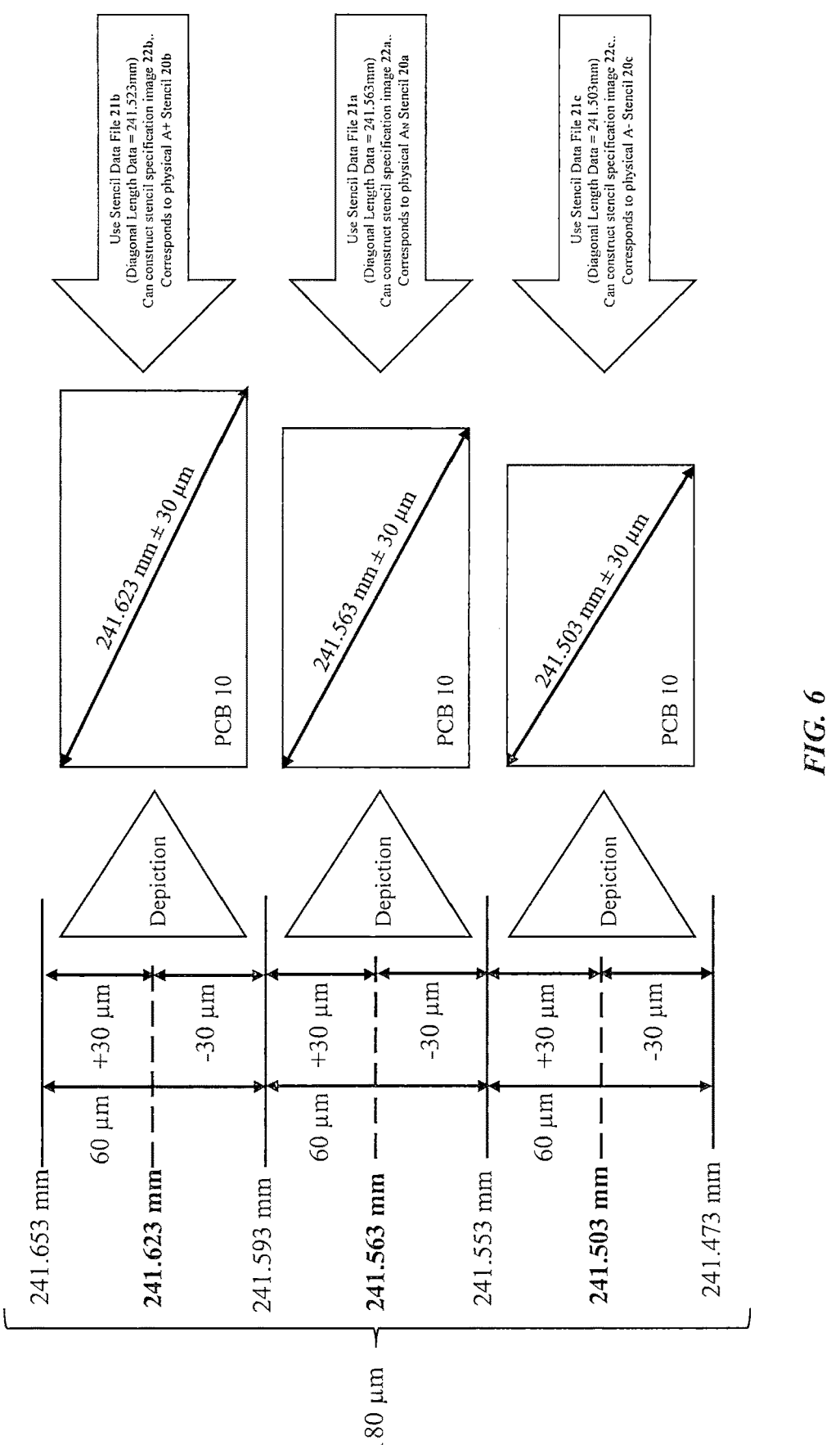
FIG. 6 is a diagram illustrating the diagonal length tolerance for the bare PCB to correspond to a stencil of specific diagonal length, the stencil represented by its stencil specification image.

Preferably, the first stencil data file 21a may be used to construct the first stencil specification image 22a, which represents a physical stencil 20a. Within its dimension data, it has a diagonal length of 241.563 mm, and this physical stencil 20a may be referred to as the normal stencil $A_N$. With this diagonal length as a nominal reference, the first diagonal length tolerance for the bare PCB 10 is configured to be ±30 μm, ranging between 241.593 mm to 241.553 mm as seen in FIG. 6.

Preferably, the second stencil data file 21b may be used to construct the second stencil specification image 22b, which represents a physical stencil 20b. Within its dimension data, it has a diagonal length of 241.623 mm, and this physical stencil 20b may be referred to as the elongated stencil A+. With this diagonal length as a nominal reference, the diagonal length tolerance for the bare PCB 10 is configured to be ±30 μm, ranging from 241.653 mm to 241.593 mm as seen in FIG. 6. In regards to its aperture coordinate data, when compared to the normal stencil 20a, the elongated stencil A+ 20b is configured to have the x-y coordinates of its apertures linearly shifted by a factor of 1.00025 (or 241.623÷241.563).

Preferably, the third stencil data file 21c may be used to construct the third stencil specification image 22c, which represents a physical stencil 20c. Within its dimension data, it has a diagonal length of 241.503 mm, and this physical stencil 20c may be referred to as the shrunk stencil A−. With this diagonal length as a nominal reference, the diagonal length tolerance is configured to be ±30 μm, ranging from 241.553 m to 241.473 m as seen in FIG. 6. In regards to its aperture coordinate data, when compared to the normal stencil 20a, the shrunk stencil A-20c is configured to have the x-y coordinates of its apertures linearly shifted by a factor of 0.99975 (or 241.563÷241.503).

Depending on how the condition determination module 121 is programmed, there are two approaches for the stencil data file 21 to be retrieved.

The first approach is to directly retrieve a stencil data file 21 from the stencil database 130 upon receiving a PCB surface data file 11, and then comparing both sets of dimension data to determine if the diagonal length of the bare PCB falls within the tolerance region of the nominal reference diagonal length included in the stencil data file 21. If so, then data dimension comparison is done.

The second approach is to pre-program the condition determination module 121 to have the tolerance regions for each nominal reference diagonal length saved therein. Upon receiving the PCB surface data file 11, its dimension data is evaluated against the tolerance regions of each nominal reference. If the dimension data manages to fall within the tolerance region of one nominal reference diagonal length, the stencil data file 21 having the diagonal length which corresponds to the nominal reference will be retrieved from the stencil database 130. Then, data dimension comparison is done.

Both approaches have their advantages and disadvantages, in particular, the first approach will allow the apparatus 100 to have better compatibility if more stencil data files are added into the stencil database 130 in the future, but it may have large computational overhead. The second approach is computationally faster, but may compromise compatibility and the condition determination module 121 has to be re-programmed every time a new stencil data file is added into the stencil database 130. It should be noted as well both approaches may be combined as well.

With the disclosed information, the entire process flow on how the apparatus 100 determines the match-successful condition or the match failure condition shall now be described in detail with reference to the flowchart in FIG. 7. It should be noted that certain steps and elaborations may be omitted, as they are discerned from the information disclosed above. It should also be noted that the flowchart in FIG. 7 uses the second approach for retrieving the stencil data file 21, and it is discernable as well with slight modifications to the flowchart in FIG. 7, the first approach can be implemented with a similar flow.

First, at step 701, the bare PCB 10 enters the apparatus 100 through the loading bay 150, and is conveyed by the conveyor mechanism 160 to be within the capture area of the image capturing device 110. Then in step 702, the image capturing device 110 will conduct surface profilometry. As per step 703, this generates a PCB surface data file 11 of the bare PCB 10, which contains the dimension data and the pad coordinate data.

With this, this PCB surface data file 11 is then sent to the condition determination module 121 to be for evaluation. It should be noted that step 704 to step 706, step 707 to step 710, step 712 to step 715, and step 716 are performed by the condition determination module 121.

Step 704 is a decision step, whereby the condition determination module 121 determines if the diagonal length of the bare PCB 10 falls within the first diagonal length tolerance ranging from 241.593 mm to 241.553 mm. If step 704 is true, then as per step 705, the first stencil data file 21a which relates to the physical $A_N$ stencil 20a would be retrieved from the stencil database 130. Through the user interface module 122 and on the user interface of the apparatus 100, the stencil specification image 22a and the surface profile image 12 of the bare PCB 10 are constructed and may be superimposed to one another. After that would be step 706, which is yet another decision step. In this step, the pad coordinate data of the PCB surface data file 11 is compared with the nominal reference (i.e., the aperture coordinate data included in the first stencil data file 21a) through the subtraction operation, to determine if the x-y coordinates of the pads on the pad layout 13 falls within the limits of the configured position offset tolerance of ±50 μm. If step 706 is true, then there is a match-successful condition. As per step 707, the bare PCB 10 is then conveyed to the $A_N$ unloading bay 170a so that it may be used with the physical $A_N$ stencil 20a for the stencil printing process later on. At this point, the operation of the apparatus 100 concludes.

If step 704 is false, then the next step is step 708, which is also a decision step. At step 708, the condition determination module 121 determines if the diagonal length of the bare PCB 10 falls within the second diagonal length tolerance ranging from 241.653 mm to 241.593 mm. If step 708 is true, then as per step 709, the second stencil data file 21b which relates to the physical A+ stencil 20b would be retrieved from the stencil database 130. Through the user interface module 122 and on the user interface of the apparatus 100, the stencil specification image 22b and the surface profile image 12 of the bare PCB 10 are constructed and may be superimposed to one another. After that would be step 710, which is yet another decision step. In this step, the pad coordinate data of the PCB surface data file 11 is compared with the nominal reference (i.e., the aperture coordinate data included in the second stencil data file 21b) through the subtraction operation, to determine if the x-y coordinates of the pads on the pad layout 13 falls within the limits of the configured position offset tolerance of ±50 μm. If step 710 is true, then there is a match-successful condition. As per step 711, the bare PCB 10 is then conveyed to the A+ unloading bay 170b so that it may be used with the physical A+ stencil 20b for the stencil printing process. At this point, the operation of the apparatus 100 concludes.

If step 708 is false, then the next step is step 712, which is also a decision step. At step 712, the condition determination module 121 determines if the diagonal length of the bare PCB 10 falls within the third diagonal length tolerance ranging from 241.53 mm to 241.473 mm. If step 708 is true, then as per step 712, the third stencil data file 21c which relates to the physical A- stencil 20c would be retrieved from the database 130. Through the user interface module 122 and on the user interface of the apparatus 100, the stencil specification image 22c and the surface profile image 12 of the bare PCB 10 are constructed and may be superimposed to one another. After that would be step 714, which is yet another decision step. In this step, the pad coordinate data of the PCB surface data file 11 is compared with the nominal reference (i.e. the aperture coordinate data included in the first stencil data file 21c) through the subtraction operation, to determine if the x-y coordinates of the pads on the pad layout 13 falls within the limits of the configured position offset tolerance of ±50 μm. If step 714 is true, then there is a match-successful condition. As per step 715, the bare PCB 10 is then conveyed to the A- unloading bay 170c so that it may be used with a physical A- stencil 20c for the stencil printing process. At this point, the operation of the apparatus 100 concludes.

If step 712 is false, then this indicates that the bare PCB 10 falls out of the 180 μm diagonal length tolerance span, and the bare PCB 10 has an abnormal dimension and cannot be used together with the $A_N$ stencil, A+ stencil, and A- stencil. Thus a match-failure condition occurs. As such as per step 716, the bare PCB 10 is regarded as "abnormal" and a copy of its PCB surface data file 11 is stored in the knowledge database 140. Then as per step 717, the bare PCB 10 is conveyed to the "abnormal" unloading bay 170d. At this point, the operation of the apparatus 100 concludes.

If step 706, step 710, or step 714 is false, then this indicates that certain pads on the bare PCB 10 have skewed or deviated out of position due to uneven thermal expansion of the FR-4 substrate of the PCB. This may occur at pads located near the edges of the bare PCB 10. Thus, a match failure condition occurs. As such, as per step 716, the bare PCB 10 is regarded as "abnormal" and a copy of its PCB surface data file 11 is stored in the knowledge database 140. Then as per step 717, the bare PCB 10 is conveyed to the "abnormal" unloading bay 170d. At this point, the operation of the apparatus 100 concludes.

Figure 7:
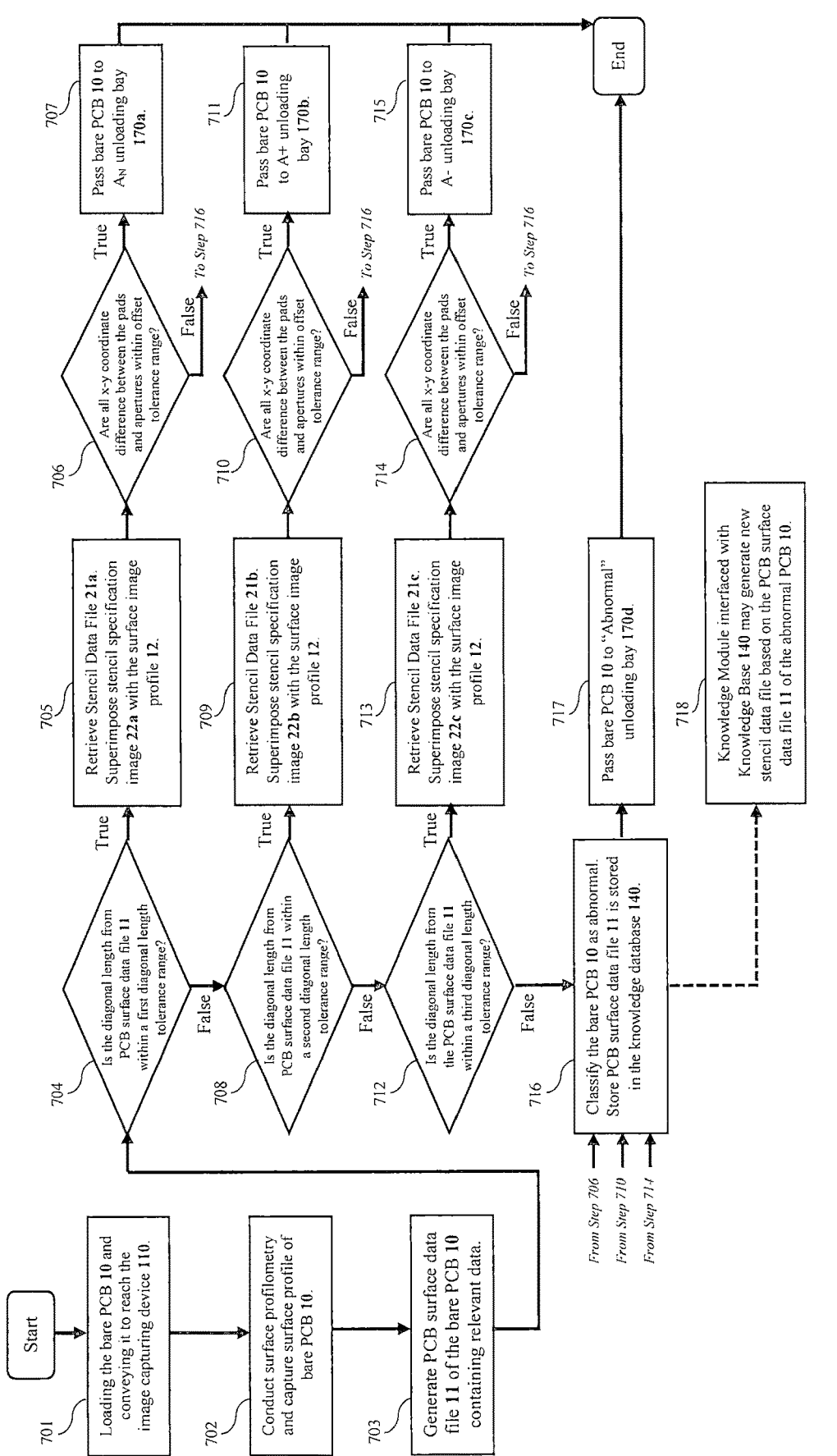
FIG. 7 is a flowchart illustrating the operational flow of the apparatus to determine a match-successful condition or a match failure condition.

The dotted arrows illustrated in FIG. 7 refer to events that can be optionally be performed by the apparatus 100. In particular, in step 718, the knowledge module (not shown) interfaced with the knowledge database 140 may use the PCB surface data file 11 of the match-failed bare PCB 10 to generate a new stencil data file that corresponds to a new stencil. This new stencil may be then physically made to accommodate the match-failed bare PCB 10 if it is deemed economically viable. Also, this new stencil data file may be stored in the stencil database 130 to be used in a future matching process.

With this, the description of the entire process flow on how the apparatus 100 determines the match-successful condition or the match failure condition has now been described in detail. It should be noted that the process flow is not limited to comparing with just three stencil data files, and may include any number of stencil data files.

Figure 8:
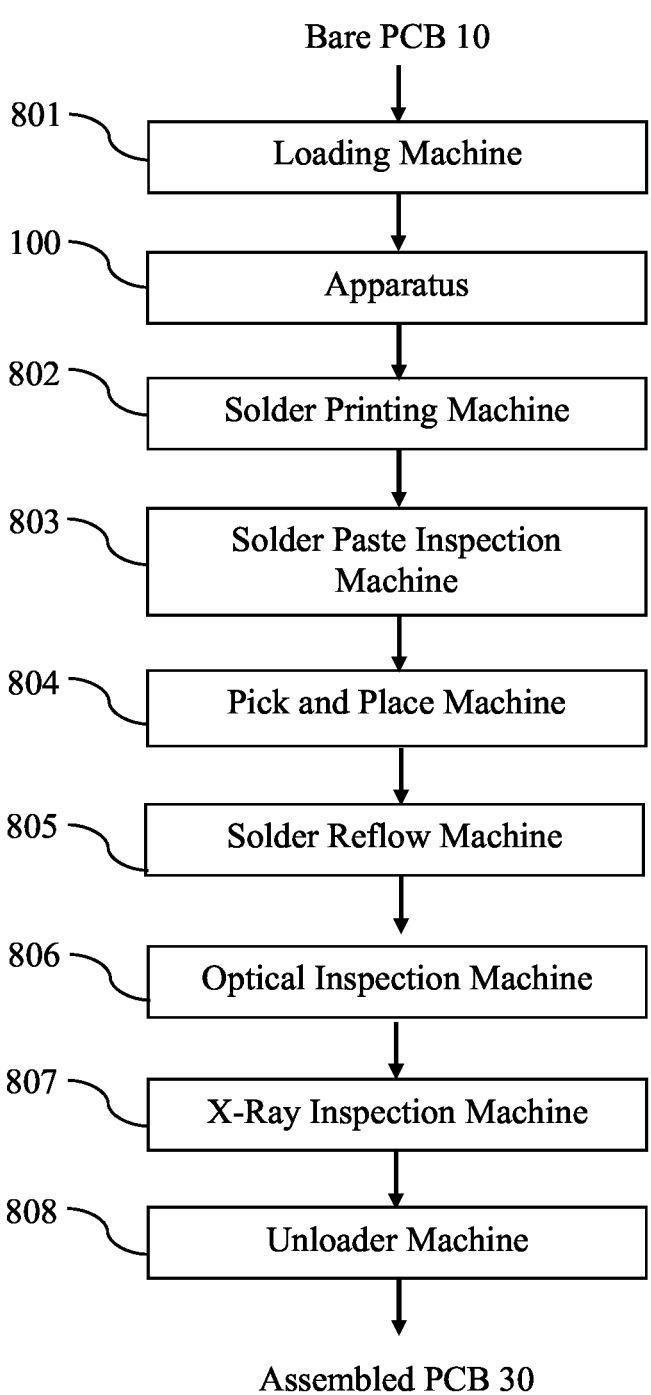
FIG. 8 is a block diagram illustrating the role and placement of the apparatus in a system for conducting solder paste on the bare PCB and forming the assembled PCB.

The apparatus may also be a member of a system for performing solder printing and forming an assembled PCB 30. Such a system is illustrated in FIG. 8. The system, inclusive of the apparatus 100, further comprises a loader machine 801, solder printing machine 802, solder paste inspection machine 803, a pick and place machine 804, a solder reflow machine 805, an automatic optical inspection machine 806, an automatic X-ray inspection machine 807, and an unloader machine 808. FIG. 8 further illustrates the interconnection between all the members of the system.

The apparatus 100 is situated to succeed the loading machine 801, and precede the solder printing machine 802. Stacks of bare PCBs 10 are loaded into the loader machine 801 to be individually passed into the apparatus 100. The operation of the apparatus 100 has been completely described previously. At the end of the operation of the apparatus 100, the apparatus 100 would have successfully sorted the stacks of bare PCB 10 into four different lots at the unloading bays 170*a*, 170*b*, 170*c*, and 170*d*. Only the lots of bare PCBs 10 at unloading bays 170*a*, 170*b*, and 170*c* will proceed to the next machine, the solder printing machine 802, for the solder printing process.

Afterwards, at the solder printing machine 802, the solder printing process is done. The solder printed machine 802 is configured to have three different physical stencils, namely the A$_N$ stencil 20*a*, the A+ stencil 20*b*, and the A− stencil 20*c*. The solder printing machine is further configured to identify the origin of the bare PCBs 10 going through it so that it can use the correct stencil to perform the stencil printing process. For example, if the bare PCB 10 originates from the lot at the unloading bay 170*a*, the physical A$_N$ stencil 20*a* is used for stencil printing, and so forth.

Succeeding the stencil printing machine 802 is the solder paste inspection machine 803 which performs automated inspection on the solder deposited the bare PCB 10 from the stencil printing process. It evaluates the deposition of the solder paste on all of the pads of the bare PCB 10 to ensure there is no spillage of solder over to the solder mask.

After that, the stencil printed bare PCB 10 is passed into a pick and place machine 804 for electronic components to be mounted thereon. The electronic components may be, but not limited, to surface-mount components and through-hole components. Due to the tacky nature of the solder paste, the electronic components would be held in place on the pads. Then the PCB with the components enters the solder reflow machine 805. The solder reflow machine 805 applies heat gradually for the solder paste to melt so that a secure solder joint can be formed between the contacts of the electronic components and the pads of the bare PCB 10. The PCB now contains electronic components and regarded as an assembled PCB 30. Afterwards, the assembled PCB 30 goes through inspection processes for the inspection of the solder joint. It goes through an optical inspection machine 806, and then an X-ray inspection machine 807. If the assembled PCB 30 passes both inspection processes, the PCB goes to the unloader machine 808 where it may be unloaded to be packaged.

Ultimately, the proposed invention can overcome the alignment mismatch between the pads on a bare PCB 10 and the apertures on a stencil 20 that occurs due to the elongation or shrinkage of the bare PCB 10. This is caused by the thermal expansion and contraction of the PCB substrate. Overcoming alignment mismatch is especially crucial for PCBs having pads of small sizes (<200 μm) which easily deviate from their original positions due to environmental factors affecting the PCB substrate. The proposed invention solves this problem and therefore solder will not spill outside the pads during the stencil printing process.

The present disclosure includes as contained in the appended claims, as well as that of the foregoing description. Although this invention has been described in its preferred form with a degree of particularity, it is understood that the present disclosure of the preferred form has been made only by way of example and that numerous changes in the details of construction and the combination and arrangements of parts may be resorted to without departing from the scope of the invention.

What is claimed is:

1. An apparatus for determining condition of a printed circuit board, comprising:
   a stencil database for storing a plurality of stencil data files corresponding to stencils of different dimensions;

an image capturing device having an area where the printed circuit board is laid thereon for a surface profile of the printed circuit board to be captured for generating a surface data file of the printed circuit board;
   a condition determination module that compares data from the surface data file with data from a plurality of stencil data files as a nominal reference via matching to determine the condition of the printed circuit board based on a set of categories, the condition includes at least one match-successful condition and at least one match-failure condition; and
   a knowledge database for storing the surface data file of at least one printed circuit board, and a knowledge module interfaced therewith;
   wherein the condition determination module compares diagonal length dimension data of the surface data file of the printed circuit board with diagonal length dimension data of each stencil data file, for one stencil data file that falls within a diagonal length tolerance to then be further compared with the surface data file of the printed circuit board in terms of position offset between aperture coordinate data of the stencil data file and the pad coordinate data of the surface data file;
   wherein the match-successful condition is determined when the aperture coordinate data of the stencil data file and the pad coordinate data of the surface data file of the printed circuit board are within an offset tolerance, in which the printed circuit board is matched with the corresponding stencil of the stencil data file for solder printing therewith;
   wherein the match-failure condition is determined when the aperture coordinate data of the stencil data file and the pad coordinate data of the surface data file of the printed circuit board fail to be within the offset tolerance, in which the surface data file of the printed circuit board with the match-failure condition is stored in the knowledge database and then be used by the knowledge module to generate a new stencil data file that is in correspondence therewith, for the new stencil data file to be stored in the stencil database for a future matching.

2. The apparatus according to claim 1, wherein the stencil data file each comprises diagonal length dimension data and the aperture coordinate data, based on a stencil specification image having an aperture layout of the stencil.

3. The apparatus according to claim 2, wherein the stencil specification images of the stencil data files include any one of a normal diagonal length stencil specification image, an enlarged diagonal length stencil specification image, and a reduced diagonal length stencil specification image.

4. The apparatus according to claim 2, wherein the surface data file comprises diagonal length dimension data and the pad coordinate data, based on a surface profile image having a pad layout of the printed circuit board.

5. The apparatus according to claim 1, wherein the categories for the match-successful condition include any one of normal, elongated and shrunk.

6. The apparatus according to claim 1, further comprising:
   a loading bay where the printed circuit board is placed thereon;
   at least one unloading bay for unloading the bare printed circuit from the apparatus; and
   a conveyor mechanism connecting the loading bay, the image capturing area and the unloading bays.

7. A system for conducting solder printing on a printed circuit board, comprising:

an apparatus for determining the condition of a printed circuit board, including:

a stencil database for storing a plurality of stencil data files corresponding to stencils of different dimensions;

an image capturing device having an area where the printed circuit board is laid thereon for a surface profile of the printed circuit board to be captured for generating a surface data file of the printed circuit board;

a condition determination module that compares data from the surface data file with data from a plurality of stencil data files as a nominal reference via matching to determine the condition of the printed circuit board based on a set of categories, the condition includes at least one match-successful condition and at least one match-failure condition;

a knowledge database for storing the surface data file of at least one printed circuit board, and a knowledge module interfaced therewith; and a solder printing machine for applying solder paste over one or more pads of the printed circuit board;

wherein the condition determination module compares diagonal length dimension data of the surface data file of the printed circuit board with diagonal length dimension data of each stencil data file, for one stencil data file that falls within a diagonal length tolerance to then be further compared with the surface data file of the printed circuit board in terms of position offset between aperture coordinate data of the stencil data file and the pad coordinate data of the surface data file;

wherein the match-successful condition is determined when the aperture coordinate data of the stencil data file and the pad coordinate data of the surface data file of the printed circuit board are within an offset tolerance, in which the printed circuit board is matched with the corresponding stencil of the stencil data file for solder printing therewith by the solder printing machine;

wherein the match-failure condition is determined when the aperture coordinate data of the stencil data file and the pad coordinate data of the surface data file of the printed circuit board fail to be within the offset tolerance, in which the surface data file of the printed circuit board with the match-failure condition is stored in the knowledge database and then be used by the knowledge module to generate a new stencil data file that is in correspondence therewith, for the new stencil data file to be stored in the stencil database for a future matching.

8. The system according to claim 7, further comprising a solder paste inspection machine for inspecting the solder paste applied on the printed circuit board.

9. The system according to claim 7, further comprising a solder reflow machine for reflowing the solder paste for a solder joint to be formed between the pads of the printed circuit board and electronic components on the printed circuit board.

10. The system according to claim 7, further comprising any one of an automatic optical inspection machine and an automatic X-ray inspection machine for inspecting the solder joint formed between the pads of the bare printed circuit board and the electronic components.

11. The system according to claim 7, further comprising any one of a loading machine for loading the printed circuit board to the system and an unloading machine for unloading the printed circuit board from the system.

12. The system according to claim 7, wherein the stencil data file of the apparatus each comprises diagonal length dimension data and the aperture coordinate data, based on a stencil specification image having an aperture layout of the stencil.

13. The system according to claim 12, wherein the stencil specification images of the stencil data files include any one of a normal diagonal length stencil specification image,/an enlarged diagonal length stencil specification image, and a reduced diagonal length stencil specification image.

14. The system according to claim 12, wherein the surface data file comprises diagonal length dimension data and the pad coordinate data, based on a surface profile image having a pad layout of the printed circuit board.

15. The system according to claim 7, wherein the categories for the match-successful condition includes any one of normal, elongated and shrunk.

16. The system according to claim 7, further comprising a conveyor mechanism that directs the printed circuit board to be moved throughout the system.

17. A method for determining condition of a printed circuit board, comprising the steps of:

capturing a surface profile of the printed circuit board by an image capturing device for generating a surface data file of it;

comparing data from the surface data file with data from a plurality of stencil data files stored in a stencil database as a nominal reference via matching executed by a condition determination module, each stencil data file corresponding to stencils of different dimensions; and determining the condition of the printed circuit board based on a set of categories by the condition determination module, the condition includes at least one match-successful condition and at least one match-failure condition; and storing the surface data file of at least one printed circuit board, by a knowledge database, in which a knowledge module is interfaced with the knowledge database;

wherein the condition determination module compares diagonal length dimension data of the surface data file of the printed circuit board with diagonal length dimension data of each stencil data file, for one stencil data file that falls within a diagonal length tolerance to then be further compared with the surface data file of the printed circuit board in terms of position offset between aperture coordinate data of the stencil data file and the pad coordinate data of the surface data file;

wherein the match-successful condition is determined when the aperture coordinate data of the stencil data file and the pad coordinate data of the surface data file of the printed circuit board are within an offset tolerance, in which the printed circuit board is matched with the corresponding stencil of the stencil data file for solder printing therewith;

wherein the match-failure condition is determined when the aperture coordinate data of the stencil data file and the pad coordinate data of the surface data file of the printed circuit board fail to be within the offset tolerance, in which the surface data file of the printed circuit board with the match-failure condition is stored in the knowledge database and then be used by the knowledge module to generate a new stencil data file that is in correspondence therewith, for the new stencil data file to be stored in the stencil database for a future matching.

18. The method according to claim 17, wherein the stencil data file of the apparatus each comprises diagonal length dimension data and the aperture coordinate data, based on a stencil specification image having an aperture layout of the stencil.

19. The method according to claim 18, wherein the stencil specification images include any one of a normal diagonal length stencil specification image, an enlarged diagonal length stencil specification image, and a reduced diagonal length stencil specification image.

20. The method according to claim 18, wherein the surface data file comprises diagonal length dimension data and the pad coordinate data, based on a surface profile image having a pad layout of the printed circuit board.

21. The method according to claim 17, wherein the categories for the match-successful condition includes any one of normal, elongated and shrunk.

* * * * *